US006725023B2

(12) United States Patent
Kasperkovitz

(10) Patent No.: US 6,725,023 B2
(45) Date of Patent: Apr. 20, 2004

(54) RADIO FM RECEIVER

(75) Inventor: Wolfdietrich Georg Kasperkovitz, Waalre (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 493 days.

(21) Appl. No.: 09/775,848

(22) Filed: Feb. 2, 2001

(65) Prior Publication Data

US 2001/0028689 A1 Oct. 11, 2001

(30) Foreign Application Priority Data

Feb. 4, 2000 (EP) .............................. 00200379

(51) Int. Cl.[7] .............................................. H04B 1/16
(52) U.S. Cl. ...................... 455/205; 455/213; 455/302; 455/337; 455/214; 375/324
(58) Field of Search ............................... 455/205, 213, 455/302, 296, 340, 337, 255, 208, 214, 307; 341/116; 375/346, 347, 350, 324, 340, 349, 277

(56) References Cited

U.S. PATENT DOCUMENTS

| | | | | |
|---|---|---|---|---|
| 4,776,039 A | * | 10/1988 | Akaiwa | 455/207 |
| 5,134,404 A | * | 7/1992 | Peterson | 341/116 |
| 5,212,825 A | * | 5/1993 | Layton | 455/205 |
| 5,376,894 A | * | 12/1994 | Petranovich | 375/324 |
| 5,430,770 A | * | 7/1995 | Abbey | 375/349 |
| 5,440,587 A | * | 8/1995 | Ishikawa et al. | 375/340 |
| 5,521,548 A | * | 5/1996 | Sugawara | 455/337 |
| 5,715,529 A | * | 2/1998 | Kianush et al. | 455/307 |
| 5,826,180 A | * | 10/1998 | Golan | 455/302 |
| 5,901,349 A | * | 5/1999 | Guegnaud et al. | 455/302 |
| 6,426,780 B1 | * | 7/2002 | Limberg et al. | 375/277 |
| 6,631,256 B2 | * | 10/2003 | Suominen | 455/302 |

FOREIGN PATENT DOCUMENTS

DE 19530812 A * 1/1996 ........... H04B/17/00

* cited by examiner

Primary Examiner—Edward F. Urban
Assistant Examiner—Lana Le

(57) ABSTRACT

A radio FM receiver is provided with a receiver portion with quadrature channels for converting received radio frequency signals into center frequency quadrature signals, a center frequency filter circuit connected to the former for suppressing undesirable image frequencies, and a first quadrature PLL demodulator for demodulating the obtained center frequency quadrature signals, said PLL being tuned to the carrier frequency within the selected frequency band. An error detector is furthermore present for detecting amplitude and phase errors in the quadrature channels, which error detector in response to the quadrature components of the center frequency signals, the quadrature signals of a VCO in the quadrature PLL demodulator, and the filtered difference said quadrature components of the center frequency signal, supplies amplitude and phase correction signals to a quadrature channel correction network which is provided between the filter circuit and the quadrature PLL demodulator.

3 Claims, 2 Drawing Sheets

RADIO FM RECEIVER

FIELD OF THE INVENTION

The invention relates to a radio FM receiver provided with a receiver portion for converting received radio frequency signals into center frequency quadrature signals, a center frequency filter circuit connected thereto for suppressing undesirable image frequencies, and a quadrature PLL (phase locked loop) demodulator with a VCO (voltage-controlled oscillator) for demodulating the obtained center frequency quadrature signals, said PLL being attuned to the carrier frequency within the selected frequency band.

BACKGROUND OF THE INVENTION

Amplitude and phase errors occur in the receiver portion and the filter circuit, with the result that undesirable image frequencies are insufficiently suppressed. These amplitude and phase errors are dependent on the input frequency, i.e. on the carrier frequency within the selected frequency band and on the amplitude of the received input signal. It is known to correct such amplitude and phase errors between the quadrature channels in the receiver, for example from U.S. Pat. Nos. 5,134,404 or 5,263,196. The correction methods described therein, however, are highly complicated and insufficiently accurate.

BRIEF DESCRIPTION OF THE DRAWINGS

It is an object of the invention to provide means whereby in a comparatively simple manner the amplitude and phase errors are eliminated to a high degree independently of the input frequency and the amplitude of the input signals, such that a considerably improved image frequency suppression is obtained.

According to the invention, the radio FM receiver is for this purpose characterized in that an error detector is present for detecting amplitude and phase errors in the quadrature channels, which error detector, in response to the quadrature components of the center frequency signals, the quadrature signals of the VCO in the quadrature PLL demodulator, and the filtered difference of said quadrature components of the center frequency signals, supplies amplitude and phase correction signals to a quadrature channel correction network which is provided between the filter circuit and the quadrature PLL demodulator.

In a preferred embodiment, the error detector is provided with a second quadrature PLL demodulator with a VCO (voltage-controlled oscillator) for demodulating the obtained center frequency quadrature signals, wherein the PLL is attuned to the carrier frequency of the image signals within the selected frequency band, with a non-linear processing unit which generates mixing signals in the first and second PLL demodulators after being supplied with the quadrature signals from the two VCOs, and with two mixing stages to each of which one of the mixing signals is supplied as well as the filtered difference of the quadrature signals from the first quadrature PLL demodulator, which mixing stages give off said correction signals after filtering.

It is furthermore possible to correct amplitude and phase errors in the quadrature channels in that only a calibration signal is supplied to the input of the receiver portion instead of reception signals obtained through the antenna. The error detector can be connected during such a calibration, whereas the connection of the error detector to the quadrature channels may be broken outside this calibration. Although the error detector can thus be given a simpler construction, the amplitude and phase errors in the quadrature channels are only corrected then for a certain calibration frequency and a certain calibration signal amplitude. Amplitude and phase errors will continue to arise for frequencies and amplitudes differing from the above.

Figure 1:
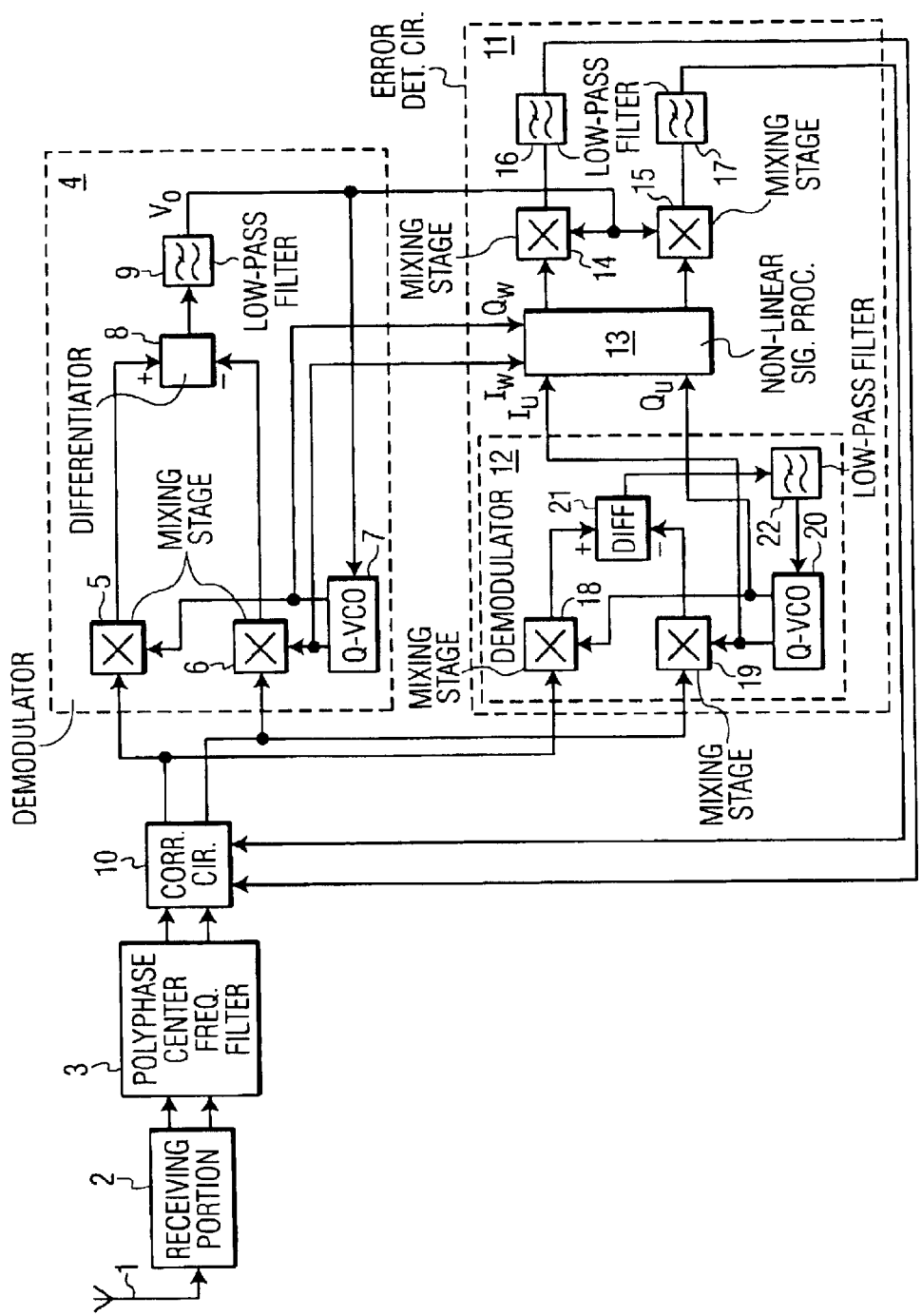

The invention will now be explained in more detail with reference to the accompanying drawing, in which:

FIG. 1 is a block diagram of an embodiment of a radio FM receiver according to the invention; and FIGS. 2A–D contain a number of amplitude (A)-frequency ($\omega$) diagrams serving to elucidate the operation of the radio FM receiver shown in FIG. 1.

DETAILED DESCRIPTION OF THE PREFERRED EMBODIMENTS

Figure 2A:
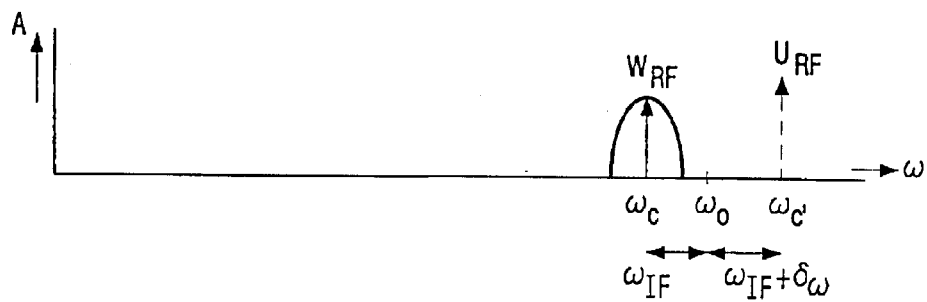
Figure 2B:
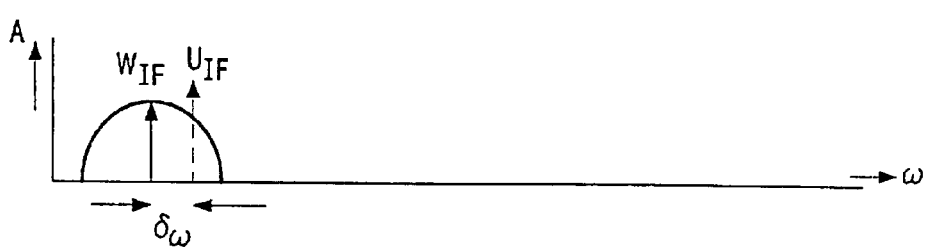

The radio FM receiver shown in FIG. 1 comprises an antenna 1, a receiver portion 2 for converting received radio frequency signals into center frequency quadrature signals i' and q' by means of an oscillator signal with a frequency $\omega_O$. Let us assume that besides a desired signal with a carrier wave frequency $\omega_C$ also an undesirable signal is received with a carrier wave frequency $\omega_{C'}$, which frequency is imaged with respect to the oscillator frequency $\omega_O$ such that upon a conversion to the center frequency this undesirable signal falls within the bandwidth of the desired reception channel. This situation is depicted in FIG. 2A. This shows the amplitudes of the desired carrier wave frequency $\omega_C$ and the undesirable carrier wave frequency $\omega_{C'}$. These two signals lie on either side of the oscillator frequency $\omega_{C'}$, with $\omega_O-\omega_C=\omega_{IF}$, and $\omega_{C'}-\omega_O=\omega_{IF}+\delta\omega$, $\delta\omega$ being so small that the undesirable signal after conversion to the center frequency will lie within the bandwich of the desired reception channel. This situation is depicted in FIG. 2B.

Figure 2C:
Figure 2D:
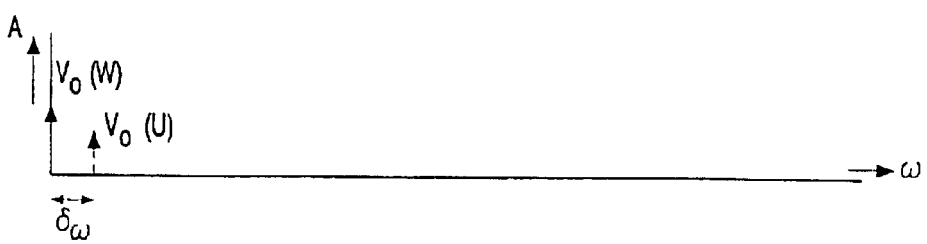

The radio FM receiver is further provided with a polyphase center frequency filter 3 in which the undesirable signals are suppressed and signals ie and qe are obtained which still contain undesirable signal components because the undesirable signals are not fully suppressed. This situation is depicted in FIG. 2C. The degree of suppression is dependent on the quadrature errors in the signals i' and q' and on those in the polyphase center frequency filter 3. The output signals of this polyphase filter ie and qe can be represented by the relations: ie=i'+q'(90° phase-rotated), and qe=q'−i'(90° phase-rotated), respectively. Only one of the two signals ie and qe would suffice for suppressing the undesirable signals without the occurrence of quadrature errors. Both signals ie and qe are necessary, however, for correcting quadrature errors, so that a further suppression of undesirable signals can be obtained.

After demodulation in a quadrature PLL (phase locked loop), a number of undesirable signals are obtained after tuning to the center frequency, the signal having the frequency $\delta\omega$ being the most unpleasant one. The amplitude and the phase of this undesirable signal are directly proportional to the amplitude of the undesirable center frequency carrier wave frequency $\omega+\delta\omega$ and directly proportional to the amplitude and phase errors in the center frequency signals ie and qe. This undesirable signal ST may be represented by the expression:

$$ST = A\{\Delta A \sin \delta\omega t + \Delta\Phi \cos \delta\omega t\},$$

in which A is the amplitude of the undesirable carrier wave frequency $\omega_{C'}$, $\Delta A$ is the relative amplitude error between the quadrature channels, and $\Delta\Phi$ is the phase error between the quadrature channels.

The demodulator 4 included in the radio FM receiver for this purpose is built up from a quadrature PLL (phase locked loop), as noted above, and comprises two mixing stages 5 and 6, a quadrature VCO (voltage-controlled oscillator) 7, a differentiator 8, and a low-pass filter 9. The demodulator is connected to the polyphase center frequency filter 3 via a correction circuit 10. As will be explained in more detail further below, the quadrature output signals of the filter 3, i.e. the signals ie and qe, are corrected as to their amplitude and phase, and the obtained quadrature signals i and q are supplied to the demodulator 4. If the VCO 7 is tuned to the center frequency of the desired signals, the filtered output signal $V_O$ of the differentiator 8 will be zero for the desired quadrature signals. The filtered difference signal of the demodulator is then only formed by said signal ST. The VCO 7 then supplies the signals $I_W = \sin \omega_{IF} t$ and $Q_W = \cos \omega_{IF} t$.

To derive the amplitude error $\Delta A$ and the phase error $\Delta \Phi$ from the signal ST, the radio FM receiver in addition comprises an error detection circuit 11. This circuit is built up from a demodulator 12 in the form of a quadrature PLL, a non-linear signal processing unit 13, two mixing stages 14 and 15, and low-pass filters 16 and 17 connected thereto. The demodulator is built up in the same manner here as the demodulator 4 and comprises two mixing stages 18 and 19, a quadrature VCO 20, a differentiator 21, and a low-pass filter 22. The VCO 20 is tuned here to the center frequency of the undesirable signals, i.e. to the frequency $\omega + \delta \omega$ of the signals i and q, and thus supplies signals $I_U = \sin (\omega_{IF} + \delta \omega) t$ and $Q_U = \cos (\omega_{IF} + \delta \omega) t$.

The demodulated signals $I_W$ and $Q_W$ obtained in the demodulator 4 and the demodulated signals $I_U$ and $Q_U$ obtained in the demodulator 12 are supplied to the non-linear processing unit 13 which calculates from these supplied signals the following signals, which are then given to the respective connected mixing stages 14 and 15:
$I_W^* Q_U - Q_W^* I_U$ and $I_W^* I_U + Q_W^* Q_I$.

The signal $I_W^* Q_U - Q_W^* I_U$ is directly proportional to $\sin \delta \omega t$, while the signal $I_W^* I_U + Q_W^* Q_I$ is directly proportional to $\cos \delta \omega t$, so that mixing of these signals in the respective mixing stages 14 and 15 with the signal $ST = A\{\Delta A \sin \delta \omega t + \Delta \Phi \cos \delta \omega t\}$ with subsequent filtering in the low-pass filters 16 and 17, respectively, yields signals which are proportional to $\Delta A$ and $\Delta \Phi$. The latter signals are supplied to the correction circuit 10 and serve as a control signal for correcting the amplitude and phase errors in the quadrature channels of the radio FM receiver.

What is claimed is:

1. A radio FM receiver comprising:
   a receiver portion for converting received radio frequency signals into center frequency quadrature signals;
   a center frequency filter circuit connected to said receiver portion for suppressing undesirable image frequencies; and
   a quadrature PLL (phase-locked loop) demodulator having a VCO (voltage-controlled oscillator) for demodulating the obtained center frequency quadrature signals, said PLL being attuned to the carrier frequency within the selected frequency band, characterized in that said radio FM receiver further comprises:
   an error detector for detecting amplitude and phase errors in the quadrature channels; and
   a quadrature channel correction network coupled between said filter circuit and the quadrature PLL demodulator, said error detector, in response to the quadrature components of the center frequency signals, the quadrature signals of the VCO in the quadrature PLL demodulator, and the filtered difference of said quadrature components of the center frequency signals, supplying amplitude and phase correction signals to said quadrature channel correction network.

2. The radio FM receiver as claimed in claim 1, characterized in that the error detector comprises:
   a second quadrature PLL demodulator having a VCO (voltage-controlled oscillator) for demodulating the obtained center frequency quadrature signals, wherein the PLL is attuned to the carrier frequency of the image signals within the selected frequency band;
   a non-linear processing unit for generating mixing signals in the first and second PLL demodulators after being supplied with the quadrature signals from the two VCOs; and
   two mixing stages for mixing a respective one of the mixing signals with the filtered difference of the quadrature signals from the first quadrature PLL demodulator, said mixing stages supplying said correction signals after filtering.

3. The radio FM receiver as claimed in claim 2, characterized in that the filtered difference of the quadrature signals from the first quadrature PLL are represented by the relation:
   $ST = A\{\Delta A \sin \delta \omega t + \Delta \Phi \cos \delta \omega t\}$,
   in which A is the amplitude of the undesirable carrier wave frequency $\omega_C$, $\Delta A$ is the relative amplitude error between the quadrature channels, and $\Delta \Phi$ is the phase error between the quadrature channels, while the output signals of the non-linear processing unit are directly proportional to the value $\sin \delta \omega t$ and $\cos \delta \omega t$, the mixing stages providing signals proportional to $\Delta A$ and $\Delta \Phi$ after filtering.

* * * * *